United States Patent [19]

Malmi et al.

[11] Patent Number: 5,313,661
[45] Date of Patent: May 17, 1994

[54] METHOD AND CIRCUIT ARRANGEMENT FOR ADJUSTING THE VOLUME IN A MOBILE TELEPHONE

[75] Inventors: Kalevi Malmi; Ari-Pekka Lajunen, both of Salo, Finland

[73] Assignee: Nokia Mobile Phones Ltd., Salo, Finland

[21] Appl. No.: 473,666

[22] Filed: Jan. 31, 1990

[30] Foreign Application Priority Data

Feb. 10, 1989 [FI] Finland .................................. 890668

[51] Int. Cl.$^5$ ............................................. H04B 1/16
[52] U.S. Cl. ............................. 455/232.1; 455/200.1; 455/248.1; 455/355
[58] Field of Search ................. 455/200, 232, 89, 177, 455/248, 249, 355, 234.2, 232.1, 200.1, 234.2, 177.1, 248.1, 249.1, 300; 359/147, 148; 381/105, 109, 111-115; 379/407, 409, 412

[56] References Cited

U.S. PATENT DOCUMENTS

| | | | |
|---|---|---|---|
| 3,024,360 | 3/1962 | Banker | 455/177 |
| 3,233,177 | 2/1966 | Stone | 455/248 |
| 3,386,053 | 5/1968 | Priddy | 455/248 |
| 3,873,921 | 3/1975 | Petrinec | 455/232 |
| 4,113,984 | 9/1978 | Gilbert et al. | 381/109 |
| 4,192,990 | 12/1988 | Beyers, Jr. | 455/234.2 |
| 4,270,216 | 5/1981 | Suzuki et al. | 455/200 |
| 4,317,222 | 2/1982 | Bell et al. | 455/77 |
| 4,495,652 | 1/1985 | Leslie | 455/200 |
| 4,528,696 | 7/1985 | Martin, III | 455/73 |
| 4,547,777 | 10/1985 | Lameraux | 455/77 |
| 4,661,994 | 4/1987 | Tanaka et al. | 455/200 |
| 4,715,062 | 12/1987 | Korsley et al. | 379/407 |
| 4,718,080 | 1/1988 | Serrano et al. | 379/59 |
| 4,790,019 | 12/1988 | Hueker | 455/355 |
| 4,797,949 | 1/1989 | Stites, III | 455/200 |
| 4,947,454 | 8/1990 | Gainer | 455/249 |
| 4,962,545 | 10/1990 | Klaczak et al. | 455/234.2 |

FOREIGN PATENT DOCUMENTS

| | | | |
|---|---|---|---|
| 0106408A3 | 10/1983 | European Pat. Off. | H03G 1/00 |
| 0286600A2 | 3/1988 | European Pat. Off. | H04B 1/08 |
| 2737466A1 | 2/1979 | Fed. Rep. of Germany | H03G 1/00 |
| 2567701A1 | 1/1986 | France | H04B 7/02 |
| 2608865A1 | 6/1986 | France | H04B 1/06 |
| 2180723A | 4/1987 | United Kingdom | 379/412 |

Primary Examiner—Reinhard J. Eisenzopf
Assistant Examiner—Lisa Charouel
Attorney, Agent, or Firm—Darby & Darby

[57] ABSTRACT

Method and circuit arrangement for adjusting the volume in a mobile telephone. The telephone comprises a transceiver unit and on the other hand a physically separate operating device. A dc voltage level (DC) corresponding to the desired volume is adjusted with a potentiometer (1) in the operating device and the level is converted with an A/D-converter (2) into a corresponding digital control signal. The control signal is read with a microprocessor (3) in the transceiver unit, which further through the hold circuit (4) controls the gain of the audio amplifier (7). A multiplexer (5) may be provided for controlling and selecting a suitable feedback resistor (6) for the amplifier. The A/D-converter can be located in the operating device or in the transceiver unit. When it is located in the transceiver unit the dc voltage level (DC) is transmitted to the transceiver unit, preferably superimposed on the AC-signal received from the microphone, which then is filtered off before the A/D-converter. The connection between the operating device and the transceiver unit may be realized with a cable or a wireless infrared or radio connection.

16 Claims, 3 Drawing Sheets

METHOD AND CIRCUIT ARRANGEMENT FOR ADJUSTING THE VOLUME IN A MOBILE TELEPHONE

BACKGROUND OF THE INVENTION

The present invention relates to a method for adjusting the volume in a mobile telephone comprising a transceiver unit and a physically separated operating device. The invention also relates to a circuit arrangement realizing the method.

In mobile telephones, the speaker amplifier is located in the transceiver unit in order to conserve space and power. It is known to use plus and minus buttons to adjust the volume of the speakers. In practice, however, it was found that a user experiences difficulties in using these plus and minus buttons directly in the transceiver unit, for example as a potentiometer, but for the user this again results in cumbersome adjustment.

It is possible to reduce the number of conductors between the operating device and the transceiver when the speaker amplifier is placed in the operating device, and at the same time audio signal interferences may be reduced. However, this complicates the use of an external speaker, and creates inconvenient currents between the operating device and the transceiver.

SUMMARY OF THE INVENTION

It is an object of the present invention to obviate the above mentioned problems and to provide a method and circuit arrangement, which presents the user with a most convenient volume control. To attain this goal the invention is characterized in that a dc voltage level corresponding to the desired volume is adjusted with circuit means in the operating device, a control signal corresponding to the dc level is supplied to a microprocessor, the control signal is read by the microprocessor, and the volume is adjusted by the control signal.

Preferably an A/D-converter is used to convert the dc level into a control signal. The converter may be located in the operating device or in the transceiver. In the last-mentioned case the dc level is transmitted preferably on the same wire as the audio signal from the microphone, whereby the audio signal is filtered from the dc signal in the transceiver.

The characteristic features of the circuit arrangement are a transceiver unit including circuit means for creating a dc voltage level corresponding to the desired volume. Either the operating device or the transceiver unit includes an A/D-converter for converting the dc voltage level to a digital control signal and the transceiver unit comprises a microprocessor for controlling the gain of the audio amplifier in accordance with the control signal. Preferably a potentiometer or a rotary switch is used as circuit means to create the dc level in the operating device.

BRIEF DESCRIPTION OF THE DRAWINGS

The invention and other features and advantages of the invention are described in more detail in the following with reference to the accompanying drawings wherein.

DETAILED DESCRIPTION OF THE INVENTION

Figure 1:
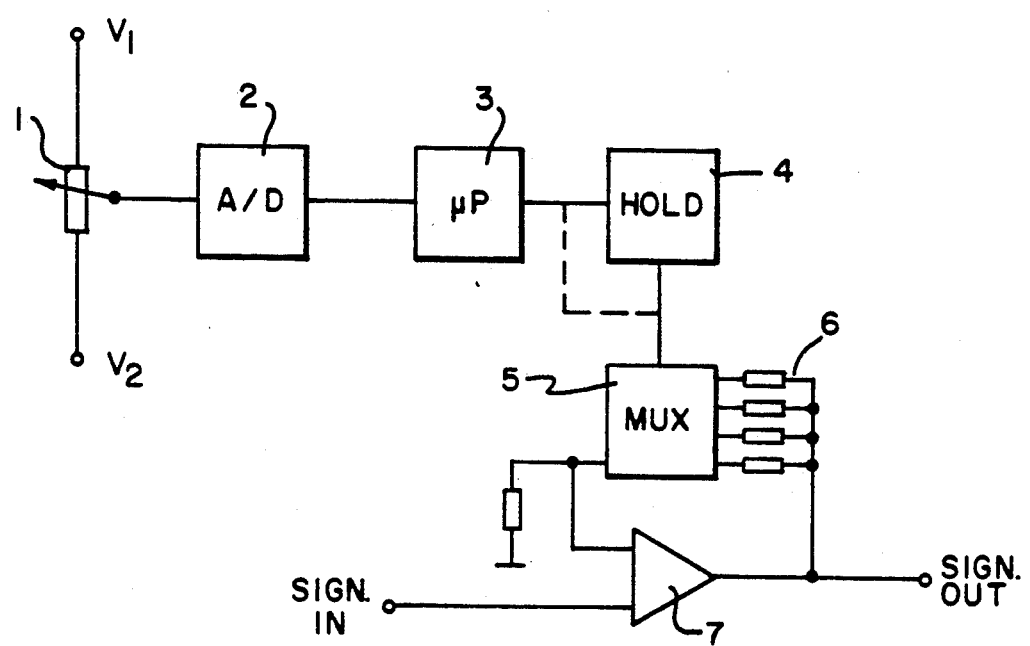
FIG. 1 shows schematically a block diagram of the circuit arrangement according to the invention.

Referring to FIG. 1 the dc voltage signal (DC) is adjusted between $V_1$ and $V_2$ volts, e.g. between 2 and 5 V. The dc level is converted into a digital control signal with the A/D-converter 2. The A/D-converter may be located in the operating device, whereby the signal to be transmitted is in digital form, or the A/D-converter is located in the transceiver unit, whereby the dc signal is transmitted from the operating device to the transceiver.

The digital control signal is read by the microprocessor 3, which controls the multiplexer 5, either directly or via the hold circuit 4. This multiplexer connects a suitable resistance 6 into the feedback circuit of the audio amplifier 7. The resistance 6 of the feedback circuit will in turn determine the gain of the amplifier 7.

Figure 2:
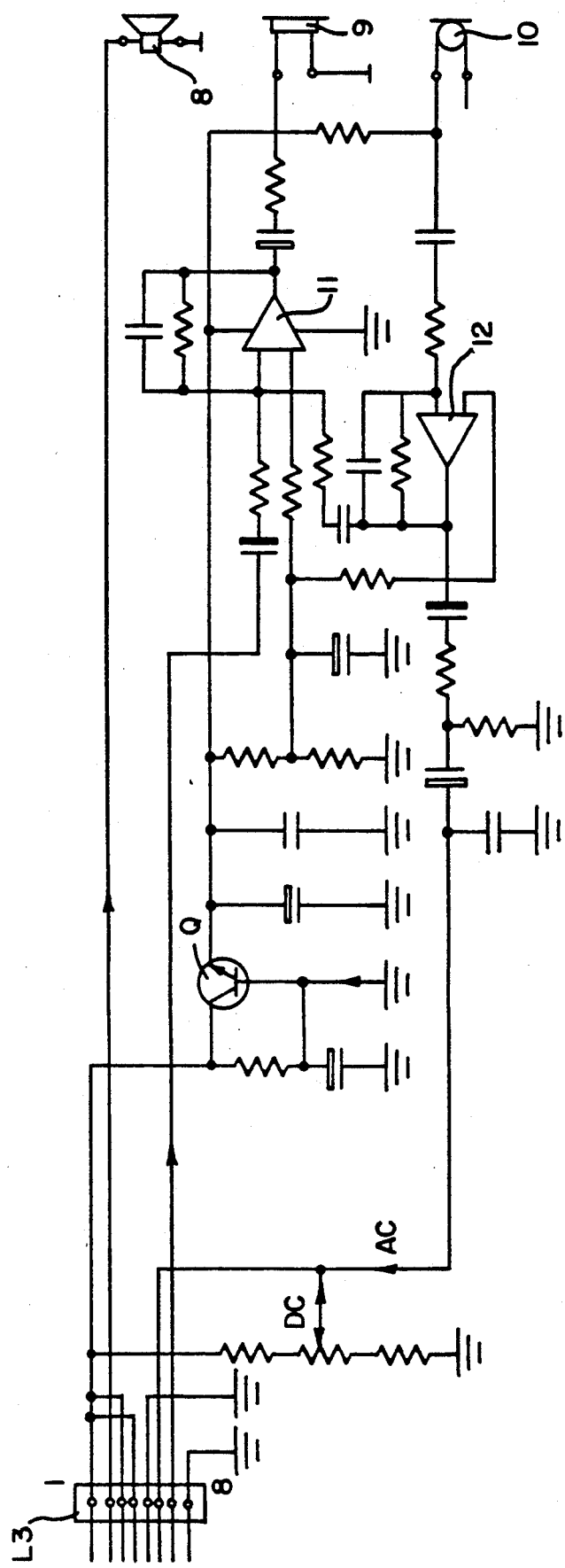
FIG. 2 shows in greater detail the circuits in the operating device according to an embodiment of the invention.
Figure 3:
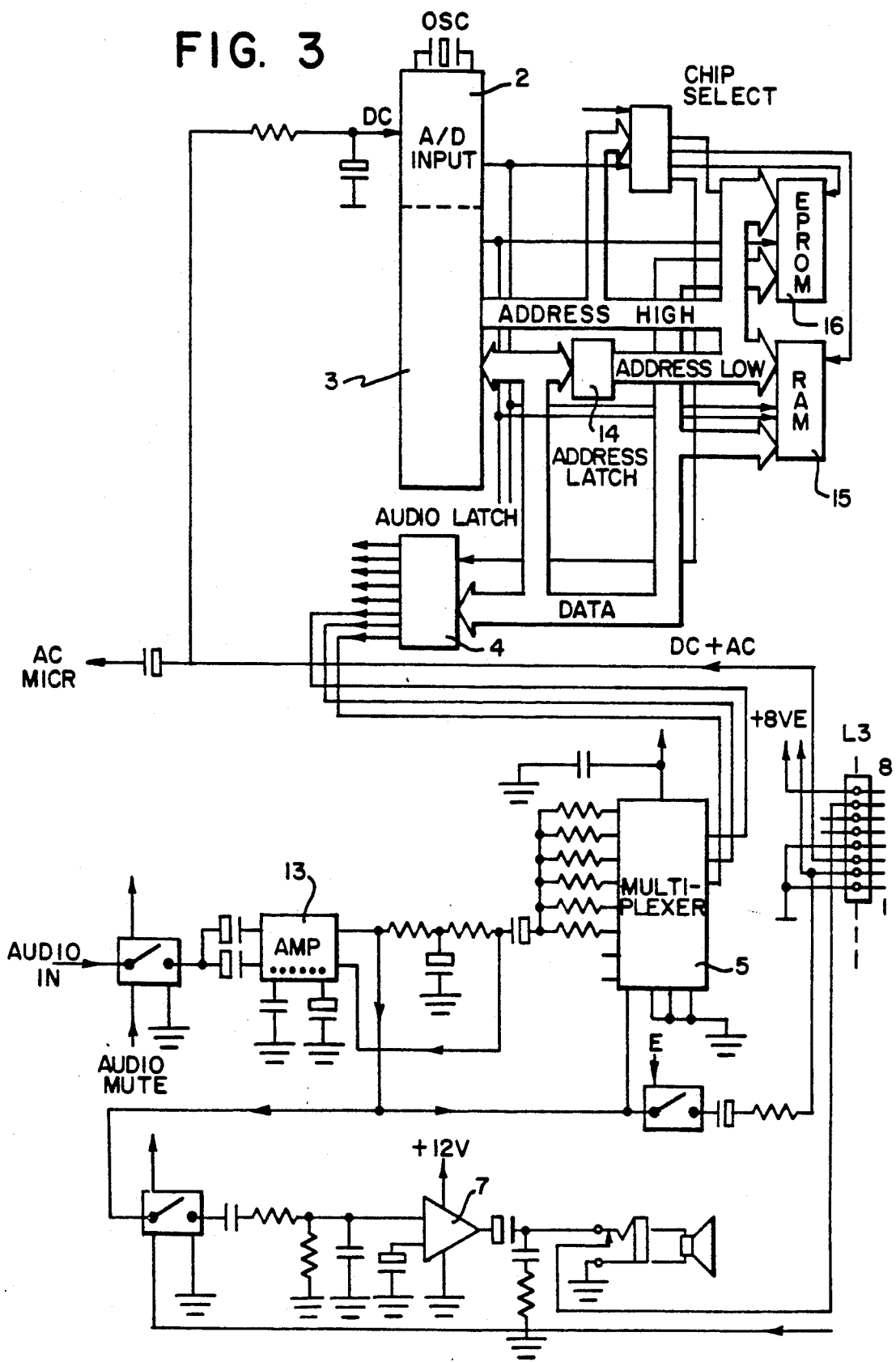
FIG. 3 shows, partly schematically, the transceiver unit to which the operating device of FIG. 2 is connected.

In FIGS. 2 and 3 there is shown in greater detail a circuit arrangement of a mobile telephone provided with a volume control according to the invention. FIG. 2 shows an operating device connected by a multiconductor cable to the transceiver unit according to FIG. 3.

Corresponding to FIG. 1, the potentiometer of the operating device is shown in FIG. 2 with the numeral 1, with which the dc voltage signal DC may be adjusted between $V_1$ and $V_2$ volts. This dc voltage signal is added to the ac voltage signal AC obtained through the microphone amplifier 12 from the microphone 10. The numeral 8 denotes the speaker, 9 the earphone and 11 the earphone amplifier.

The dc voltage level DC which is chosen by the user with the potentiometer 1, and the microphone signal AC superimposed on it, are transmitted on the same cable conductor to the transceiver unit, and more precisely to its microprocessor 3. The AC-signal is filtered off in the filter 17 before the microprocessor 3.

In the present embodiment (FIG. 3) the microprocessor 3 also contains the A/D-converter 2 with which the dc level (DC) is converted to a digital control signal. The control signal is connected through the hold circuit 4 to the multiplexer 5, which in accordance with the control signal selects a feedback resistor for the expander/operational amplifier 13. The audio signal from the operational amplifier 13 is connected through the speaker amplifier 7 either to the speaker in the transmitter amplifier unit or to the speaker 8 in the operating device. The audio signal connected to the earphone 9 (FIG. 2) is taken directly from the amplifier 13 without a speaker amplifier.

The transceiver unit further comprises an address hold circuit 14, a RAM memory 15 and an EPROM memory 16, contains the program controlling the functions of the telephone and which includes the control of the A/D-converter and converts the control signal from the converter into a control signal for the multiplexer.

In place of the described potentiometer 1 a rotary switch could of course be used, for example. The A/D-converter may also be located in the operating device, whereby the control signal is transmitted in digital form to the transceiver unit from the operating device. Especially in such a case, a wireless connection or data bus preferably may be used in place of the connecting cable between the operating device and the transceiver. Such a connection is realized by means known per se operating in the infrared band or alternatively by radio. Thereby a microprocessor is suitably provided also in the operating device in connection with the A/D-converted, with the microprocessor transmitting the control data to the data bus between the operating device and the transceiver unit.

We claim:

1. Method for user adjustment of the volume of a mobile telephone including a transceiver unit and a physically separated operating device, comprising the steps of:
   manually adjusting a dc voltage level of said telephone to provide a desired volume using circuit means in the operating device, said voltage level being variable in a preselected voltage range,
   supplying a control signal corresponding to the dc voltage level to a microprocessor,
   reading the control signal with the microprocessor,
   adjusting the volume in relation to the control signal by controlling the gain of an audio amplifier through a multiplexer connected to the microprocessor, said multiplexer selecting an impedance connected in series with an input impedance of said audio amplifier.

2. A method according to claim 1, wherein the dc voltage level is converted to the control signal in the A/D-converter.

3. A method according to claim 2, wherein the converting to the control signal is provided in the operating device.

4. A method according to claim 2, wherein the converting to the control signal is provided in the transceiver unit.

5. A method according to claim 3 or 4, wherein the dc voltage level or the control signal is transmitted to the transceiver unit through a cable.

6. A method according to claim 5, characterized in that the dc voltage level is transmitted on a same conductor together with an audio signal from a microphone.

7. A method according to claim 1, wherein a second microprocessor is also provided in the operating device in connection with an A/D-converter, the second microprocessor transmitting the controls signal to a data bus between said operating device and said transceiver unit, thus providing volume control in accordance with the control signal.

8. A method according to claim 3, wherein the control signal is transmitted to the transceiver unit via one of more data lines.

9. A method according to claim 8, wherein the transmission is provided as a wireless infrared connection.

10. A method according to claim 1 wherein the dc voltage level is selected with a potentiometer.

11. Circuit arrangement for user adjustment of the volume in a mobile telephone, comprising:
    a transceiver unit;
    a physically separated operating device having circuit means for creating a dc voltage level corresponding to a desired volume,
    an A/D-converter for converting the dc voltage level to a digital control signal,
    a microprocessor in the transceiver unit for controlling the gain of an audio amplifier, and
    a multiplexer associated with said amplifier and connected to the microprocessor, said multiplexer selecting an impedance in series with in input impedance of said audio amplifier, and being selectably variable in accordance with the control digital signal to control the gain of the audio amplifier.

12. Circuit arrangement according to claim 11, wherein the circuit means of the circuit arrangement for creating the dc voltage level comprises a potentiometer.

13. Method for adjusting the volume in a mobile telephone comprising a transceiver unit and a physically separated operating device, characterized by the steps of
    adjusting a dc voltage level to correspond to a desired volume with circuit means in the operating device,
    supplying a control signal corresponding to the dc level to a microprocessor,
    reading the control signal with the microprocessor,
    adjusting the volume in accordance with the control signal,
    said control signal being generated by an A/D-converter in the operating device and sent to the transceiver unit through a cable and on the same conductor together with an audio signal from a microphone in said transceiver unit.

14. A method according to claim 8, wherein the transmission is provided via a radio connection.

15. A method according to claim 1, wherein the dc voltage level is selected by a rotary switch.

16. Circuit arrangement according to claim 11, wherein the circuit means for creating the dc voltage comprises a rotary switch.

* * * * *